(12) United States Patent
Murata et al.

(10) Patent No.: US 7,449,396 B2  
(45) Date of Patent: *Nov. 11, 2008

(54) WAFER DIVIDING METHOD

(75) Inventors: Masahiro Murata, Tokyo (JP); Yusuke Nagai, Tokyo (JP); Yukio Morishige, Tokyo (JP); Satoshi Kobayashi, Tokyo (JP); Naoki Ohmiya, Tokyo (JP)

(73) Assignee: Disco Corporation, Tokyo (JP)

( * ) Notice: Subject to any disclaimer, the term of this patent is extended or adjusted under 35 U.S.C. 154(b) by 647 days.

This patent is subject to a terminal disclaimer.

(21) Appl. No.: 11/047,585

(22) Filed: Feb. 2, 2005

(65) Prior Publication Data

US 2005/0170613 A1  Aug. 4, 2005

(30) Foreign Application Priority Data

Feb. 3, 2004 (JP) .............................. 2004-026532

(51) Int. Cl.  
*H01L 21/301* (2006.01)

(52) U.S. Cl. ...................................... 438/463; 438/464

(58) Field of Classification Search ................. 438/460, 438/462–464, 928  
See application file for complete search history.

(56) References Cited

U.S. PATENT DOCUMENTS 7,179,722 B2 * 2/2007 Murata et al. ............... 438/460

FOREIGN PATENT DOCUMENTS

JP                3 408 805           3/2003

* cited by examiner

*Primary Examiner*—Jack Chen  
(74) *Attorney, Agent, or Firm*—Smith, Gambrell & Russell, LLP

(57) ABSTRACT

A method of dividing, along dividing lines, a wafer having function elements formed in areas sectioned by the dividing lines formed in a lattice pattern on the front surface, comprising: a frame holding step for affixing the back surface of the wafer to a dicing tape mounted on an annular frame; a deteriorated layer forming step for forming a deteriorated layer along the dividing lines in the inside of the wafer by applying a pulse laser beam capable of passing through the wafer to the wafer along the dividing lines, from the side of the front surface of the wafer held on the frame; a dividing step for dividing the wafer into individual chips along the dividing lines by exerting external force along the dividing lines where the deteriorated layers have been formed of the wafer held on the frame; an expansion step for enlarging the interval between chips by stretching the dicing tape affixed to the wafer divided into individual chips; and a picking up step for picking up each chip from the expanded dicing tape.

3 Claims, 9 Drawing Sheets

(a)

(b)

(a)

(b)

(a)

(b)

WAFER DIVIDING METHOD

FIELD OF THE INVENTION

The present invention relates to a wafer dividing method comprising dividing, along dividing lines, a wafer having function elements formed in areas sectioned by the dividing lines formed in a lattice pattern on the front surface, and picking up the obtained individual chips.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit (function element) such as IC or LSI is formed in each of the sectioned areas. Individual semiconductor chips are manufactured by cutting the semiconductor wafer along the dividing lines to divide it into the areas having a circuit formed therein. An optical device wafer comprising light-sensitive elements (function elements) such as photodiodes or light-emitting elements (function elements) such as laser diodes laminated on the front surface of a sapphire substrate is also cut along dividing lines to be divided into individual optical devices such as photodiodes or laser diodes, and these optical devices are widely used in electric equipment.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means includes a spindle unit that comprises a rotary spindle, a cutting blade mounted on the spindle and a rotary drive mechanism for driving the rotary spindle. The cutting blade comprises a disk-like base and an annular cutting edge, which is mounted on the side wall peripheral portion of the base and formed as thick as about 20 μm by fixing diamond abrasive grains having a diameter of about 3 μm to the base by electroforming.

Since the cutting blade has a thickness of about 20 μm, the dividing lines for sectioning chips must have a width of about 50 μm and hence, the area ratio of the dividing lines to the wafer is large, thereby reducing productivity. Further, since a sapphire substrate, silicon carbide substrate and the like have high Mohs hardness, cutting with the above cutting blade is not always easy.

As a means of dividing a plate-like workpiece such as a semiconductor wafer, a laser processing method for applying a pulse laser beam capable of passing through the workpiece with its focusing point set to the inside of the area to be divided is also attempted nowadays. In the dividing method making use of this laser processing technique, the workpiece is divided by applying a pulse laser beam having an infrared range capable of passing through the workpiece with its focusing point set to the inside to the workpiece, from one surface side of the workpiece to continuously form a deteriorated layer along the dividing lines in the inside of the workpiece and exerting external force along the dividing lines whose strength has been reduced by the formation of the deteriorated layers. This method is disclosed by Japanese Patent No. 3408805, for example.

Although a process for dividing the wafer into individual chips by completely cutting it with the above cutting machine and picking up the chips has been established, a production line making use of this technique is not established yet and its development is under way through trial and error because a technique for forming a deteriorated layer along the dividing lines in the inside of the wafer by using a pulse laser beam cannot divide the wafer perfectly.

SUMMARY OF THE INVENTION

It is an object of the present invention to provide a wafer dividing method capable of establishing a process comprising the steps of forming a deteriorated layer along dividing lines in the inside of a wafer by using a pulse laser beam, dividing the wafer into individual chips along the deteriorated layers and picking up the chips.

To attain the above object, according to the present invention, there is provided a method of dividing, along dividing lines, a wafer having function elements formed in areas sectioned by the dividing lines formed in a lattice pattern on the front surface, comprising:

a frame holding step for affixing the back surface of the wafer to a dicing tape mounted on an annular frame;

a deteriorated layer forming step for forming a deteriorated layer along the dividing lines in the inside of the wafer by applying a pulse laser beam capable of passing through the wafer to the wafer along the dividing lines, from the side of the front surface of the wafer held on the frame;

a dividing step for dividing the wafer into individual chips along the dividing lines by exerting external force along the dividing lines where the deteriorated layers have been formed of the wafer held on the frame;

an expansion step for enlarging the interval between chips by stretching the dicing tape affixed to the wafer divided into individual chips; and a picking up step for picking up each chip from the expanded dicing tape.

Preferably, the deteriorated layers formed in the inside of the wafer in the deteriorated layer forming step are exposed to at least the back surface of the wafer.

Preferably, the above dividing step is carried out by stretching the dicing tape in the expansion step.

Since the wafer dividing method of the present invention comprises the above steps, it is possible to establish a process comprising the steps of forming the deteriorated layer along the dividing lines in the inside of the wafer by applying a pulse laser beam capable of passing through the wafer having function elements in the areas sectioned by the dividing lines formed on the front surface in a lattice pattern to the wafer along the dividing lines, dividing the wafer into individual chips along the deteriorated layers and picking up the chips.

DETAILED DESCRIPTION OF THE PREFERRED EMBODIMENTS

Preferred embodiments of the present invention will be described in detail hereinunder with reference to the accompanying drawings.

Figure 1:
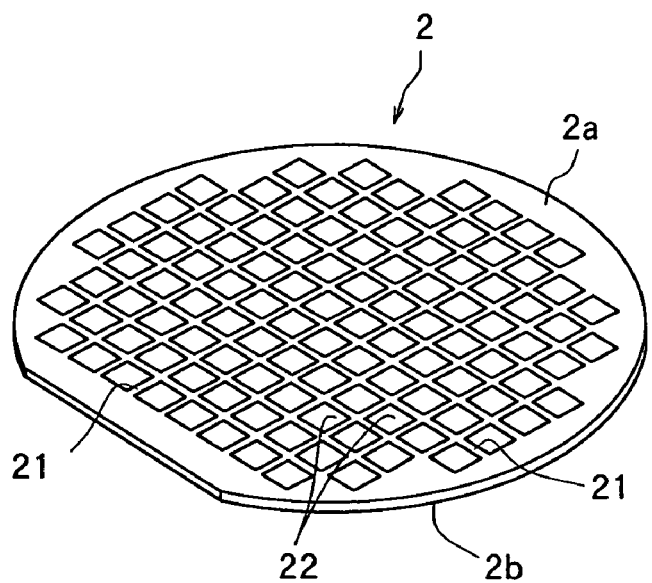
FIG. 1 is a perspective view of a semiconductor wafer to be divided by the wafer dividing method of the present invention.

FIG. 1 is a perspective view of a semiconductor wafer as a wafer to be divided according to the present invention. The semiconductor wafer 2 shown in FIG. 1 is a silicon wafer having a plurality of dividing lines 21 formed in a lattice pattern on the front surface 2a, and circuits 22 are formed as function elements in a plurality of areas sectioned by the plurality of dividing lines 21. The front surface 2a of the thus constituted semiconductor wafer 2 is polished to a predetermined thickness.

Figure 2:
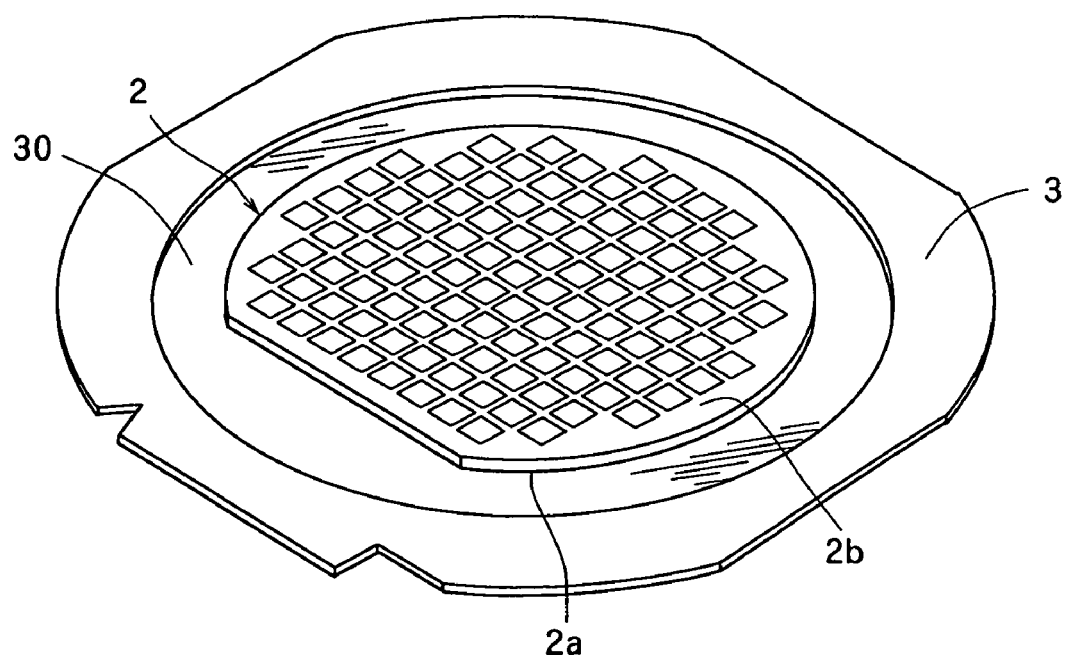
FIG. 2 is a perspective view showing a state where a back surface of the semiconductor wafer shown in FIG. 1 is affixed to a dicing tape mounted on an annular frame.

The back surface 2b of the above-described semiconductor wafer 2 is held on a dicing tape mounted to an annular frame (frame holding step). In this frame holding step, as shown in FIG. 2, the back surface 2b of the semiconductor wafer 2 is put on the surface of the extensible dicing tape 30 mounted on the annular frame 3. The above dicing tape 30 is manufactured by coating acrylic resin paste to the surface of a 100 µm-thick sheet substrate made of polyvinyl chloride (PVC) to a coating thickness of about 5 µm in the illustrated embodiment. This paste has the property of reducing its adhesive force by an external stimulus such as ultraviolet radiation.

After the above-described frame holding step, there comes the step of forming a deteriorated layer along the dividing lines in the inside of the wafer by applying a pulse laser beam capable of passing through the wafer to the wafer along the dividing lines from the front surface 2a side of the semiconductor wafer 2. This deteriorated layer forming step is carried out by using a laser beam processing machine 4 shown in FIGS. 3 to 5. The laser beam processing machine 4 shown in FIGS. 3 to 5 comprises a chuck table 41 for holding a workpiece, a laser beam application means 42 for applying a laser beam to the workpiece held on the chuck table 41 and an image pick-up means 43 for picking up an image of the workpiece held on the chuck table 41. The chuck table 41 is so constituted as to suction-hold the workpiece and moved in a processing-feed direction indicated by an arrow X and an indexing-feed direction indicated by an arrow Y in FIG. 3 by a moving mechanism that is not shown.

Figure 4:
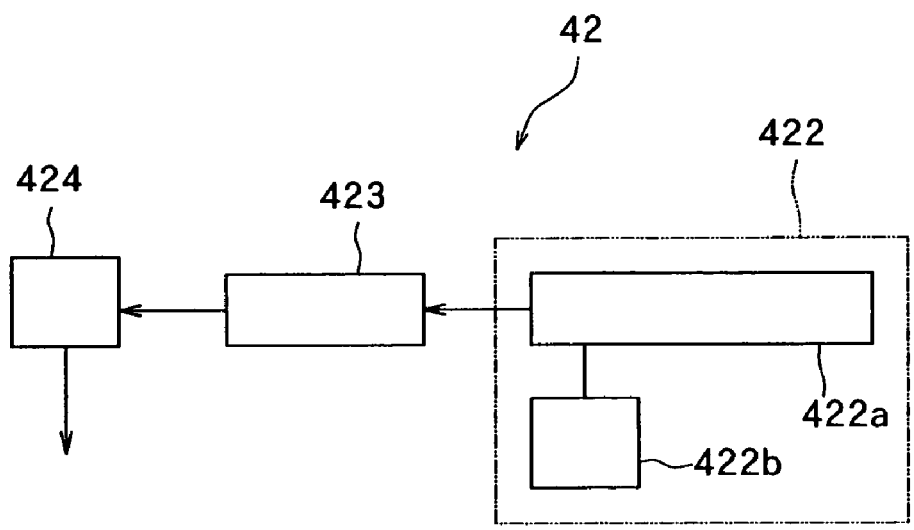
FIG. 4 is a block diagram schematically showing the constitution of the laser beam application means provided in the laser beam processing machine shown in FIG. 3.
Figure 5:
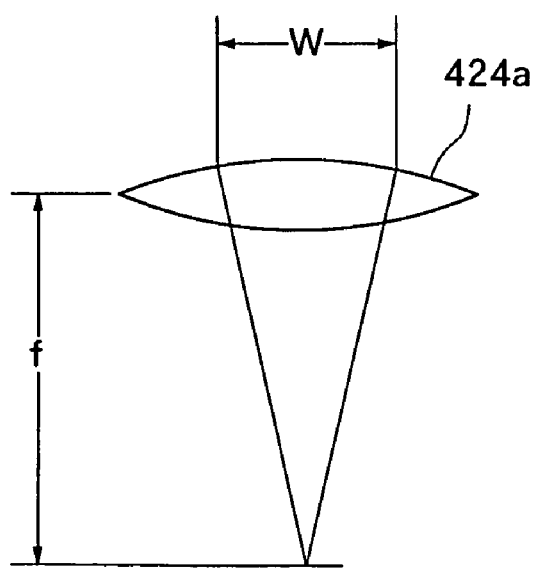
FIG. 5 is a schematic diagram for explaining the focusing spot diameter of a pulse laser beam.

The above laser beam application means 42 has a cylindrical casing 421 arranged substantially horizontally. In the casing 421, as shown in FIG. 4, a pulse laser beam oscillation means 422 and a transmission optical system 423 are installed. The pulse laser beam oscillation means 422 comprises a pulse laser beam oscillator 422a composed of a YAG laser oscillator or YVO4 laser oscillator and a repetition frequency setting means 422b connected to the pulse laser beam oscillator 422a. The transmission optical system 423 comprises suitable optical elements such as a beam splitter, etc. A condenser 424 housing condensing lenses (not shown) constituted by a set of lenses that may have a known formation is attached to the end of the above casing 421. A laser beam oscillated from the above pulse laser beam oscillation means 422 reaches the condenser 424 through the transmission optical system 423 and is applied from the condenser 424 to the workpiece held on the above chuck table 41 at a predetermined focusing spot diameter D. This focusing spot diameter D is defined by the expression D ($\mu$m)=4×$\lambda$×f/($\pi$×W) (wherein $\lambda$ is the wavelength ($\mu$m) of the pulse laser beam, W is the diameter (mm) of the pulse laser beam applied to an objective lens 424a, and f is the focusing distance (mm) of the objective lens 424a) when the pulse laser beam having a Gauss distribution is applied through the objective condenser lens 424a of the condenser 424 as shown in FIG. 5.

The image pick-up means 43 mounted onto the end of the casing 421 constituting the above laser beam application means 42 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that will be described hereinafter.

The deteriorated layer forming step which is carried out by using the above laser beam processing machine 4 will be described with reference to FIG. 3, FIGS. 6(a) and 6(b) and FIG. 7.

Figure 3:
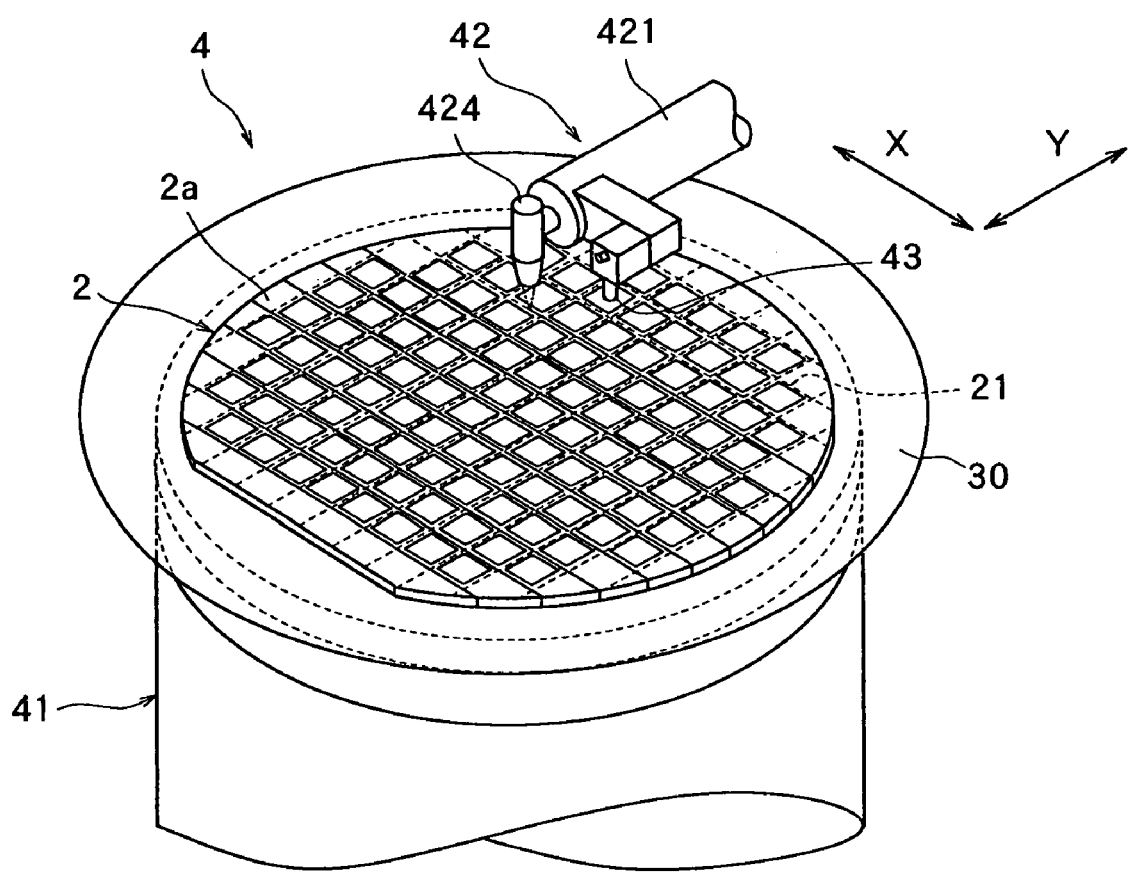
FIG. 3 is a perspective view of the principal section of a laser beam processing machine for carrying out the deteriorated layer forming step in the wafer dividing method of the present invention.

In this deteriorated layer forming step, the dicing tape 30 side of the semiconductor wafer 2 is first placed on the chuck table 41 of the laser beam processing machine 4 shown in FIG. 3 (therefore, the front surface 2a of the semiconductor wafer 2 faces up), and the semiconductor wafer 2 is suction-held on the chuck table 41 by a suction means that is not shown. In FIG. 3, FIGS. 6(a) and 6(b) and FIG. 7, the annular frame 3 mounting the dicing tape 30 is omitted but it is supported by the suitable clamp mechanism of the chuck table 41. The chuck table 41 suction-holding the semiconductor wafer 2 is brought to a position right below the image pick-up means 43 by a moving mechanism that is not shown.

After the chuck table 41 is positioned right below the image pick-up means 43, alignment work for detecting the area to be processed of the semiconductor wafer 2 is carried out by using the image pick-up means 43 and the control means that is not shown. That is, the image pick-up means 43 and the control means (not shown) carry out image processing such as pattern matching, etc., to align a dividing line 21 formed in a predetermined direction of the semiconductor wafer 2 with the condenser 424 of the laser beam application means 42 for applying a laser beam along the dividing line 21, thereby performing the alignment of a laser beam application position. The alignment of the laser beam application position is also carried out on dividing lines 21 that is formed on the semiconductor wafer 2 and extend in a direction perpendicular to the above predetermined direction.

Figure 6:
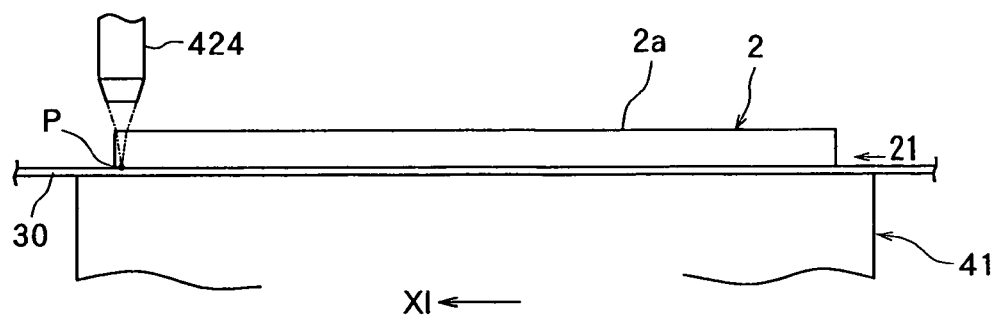
FIGS. 6(a) and 6(b) are diagrams for explaining the deteriorated layer forming step in the wafer dividing method of the present invention.
Figure 6:
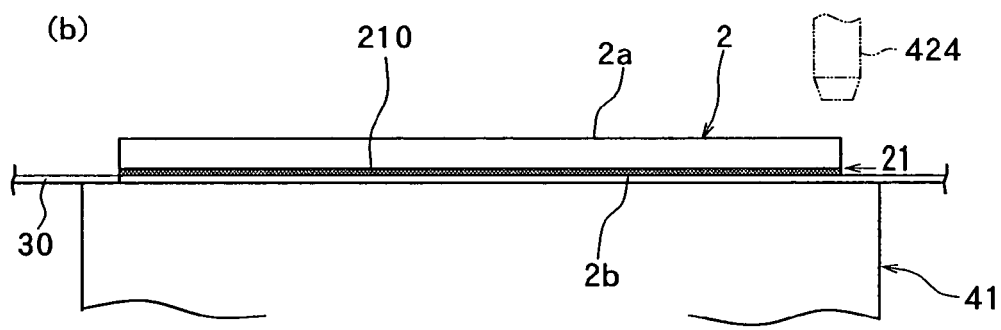

After the dividing line 21 formed on the semiconductor wafer 2 held on the chuck table 41 is detected and the alignment of the laser beam application position is carried out as described above, the chuck table 41 is moved to a laser beam application area where the condenser 424 of the laser beam application means 42 for applying a laser beam is located as shown in FIG. 6(a), so as to position one end (left end in FIG. 6(a)) of the predetermined dividing line 21 right below the condenser 424 of the laser beam application means 42. The chuck table 41, that is, the semiconductor wafer 2 is moved in the direction indicated by the arrow X1 in FIG. 6(a) at a predetermined feed rate while a pulse laser beam capable of passing through the semiconductor wafer is applied from the condenser 424. When the application position of the condenser 424 of the laser beam application means 42 reaches the other end of the dividing line 21 as shown in FIG. 6(b), the application of the pulse laser beam is suspended and the movement of the chuck table 41, that is, the semiconductor wafer 2 is stopped. In this deteriorated layer forming step, by setting the focusing point P of the pulse laser beam to a position near the back surface 2b (undersurface) of the semiconductor wafer 2, a deteriorated layer 210 which is exposed to the back surface 2b (undersurface) is formed inward from the back surface 2b. This deteriorated layer 210 is formed as a molten-resolidified layer of which the wafer has been once molten and then re-solidified. By forming the deteriorated layer 210 exposed to the back surface 2b of the semiconductor wafer 2, the semiconductor wafer 2 can be easily divided by exerting external force along the deteriorated layers 210.

The processing conditions in the above deteriorated layer forming step are set as follows, for example.
Light source: LD excited Q switch Nd: YVO4 laser
Wavelength: pulse laser having a wavelength of 1,064 nm
Pulse output: 10 µJ
Focusing spot diameter: 1 µm
Pulse width: 40 ns
Peak power density of focusing point: $3.2 \times 10^{10}$ W/cm$^2$
Repetition frequency: 100 kHz
Processing-feed rate: 100 mm/sec.

Figure 7:
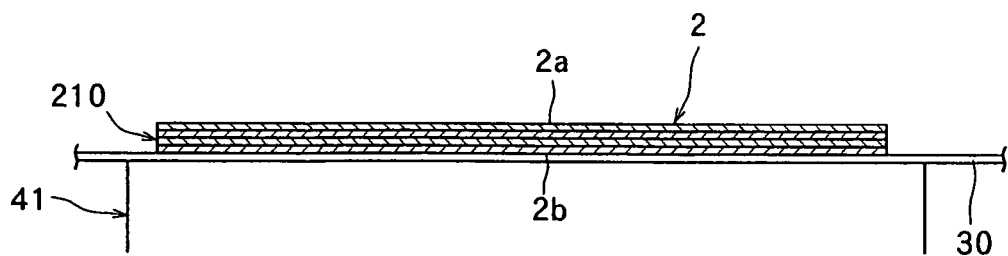
FIG. 7 is a diagram showing a state where deteriorated layers are formed in the inside of the wafer in the deteriorated layer forming step shown in FIGS. 6(a) and 6(b)

When the semiconductor wafer 2 is large in thickness, as shown in FIG. 7, the above-described deteriorated layer forming step is carried out several times by changing the focusing point P stepwise so as to form a plurality of deteriorated layers 210. Since the deteriorated layer formed once under the above processing conditions is as thick as about 50 µm, six deteriorated layers are formed in the wafer 2 having a thickness of 300 µm in the illustrated embodiment. As a result, the deteriorated layers 210 formed in the inside of the semiconductor wafer 2 extend from the back surface 2b to the front surface 2a along the dividing line 21.

The step of dividing the semiconductor wafer 2 along the dividing lines 21 comes after the above deteriorated layer forming step.

Figure 8:
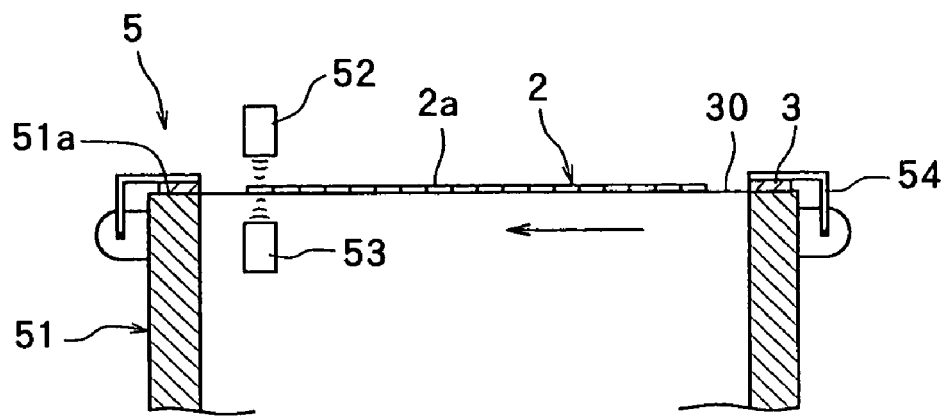
FIG. 8 is a diagram showing a first embodiment of the dividing step in the wafer dividing method of the present invention.

A first example of the dividing step will be described with reference to FIG. 8. This first example of the dividing step shown in FIG. 8 is carried out by using an ultrasonic dividing device 5. The ultrasonic dividing device 5 comprises a cylindrical base 51, a first ultrasonic generator 52 and a second ultrasonic generator 53. The cylindrical base 51 constituting the ultrasonic dividing device 5 has, at its top surface, a placing surface 51a for placing the above frame 3 so that the frame 3 is placed thereon and fixed by clamps 54. This base 51 is so constituted as to be able to be moved in a horizontal direction and a direction perpendicular to the sheet in FIG. 8 and to be turned by a moving means that is not shown. The first ultrasonic generator 52 and the second ultrasonic generator 53 constituting the ultrasonic dividing device 5 are arranged at opposite positions above and below the semiconductor wafer 2 supported on the frame 3 placed on the placing surface 51a of the cylindrical base 51 via the dicing tape 30 and generate longitudinal waves (compressional waves) having a predetermined frequency. To carry out the above dividing step by using the thus constituted ultrasonic dividing device 5, the frame 3 supporting the semiconductor wafer 2 (in which the deteriorated layers 210 are formed along the dividing lines 21) via the dicing tape 30 is placed on the placing surface 51a of the cylindrical base 51 in such a manner that the dicing tape 30-placing side comes into contact with the placing surface 51a (therefore, the front surface 2a of the semiconductor wafer 2 faces up) and fixed by the clamps 54. Thereafter, the base 51 is operated by the moving means (not shown) to bring one end (left end in FIG. 8) of a predetermined dividing line 21 formed on the semiconductor wafer 2 to a position where ultrasonic waves from the first ultrasonic generator 52 and the second ultrasonic generator 53 can act thereon. The first ultrasonic generator 52 and the second ultrasonic generator 53 are respectively activated to generate longitudinal waves (compressional waves) having a frequency of, for example, 28 kHz while the base 51 is moved in the direction indicated by the arrow at a feed rate of 50 to 100 m/sec. As a result, ultrasonic waves from the first ultrasonic generator 52 and the second ultrasonic generator 53 act on the front surface and back surface of the semiconductor wafer 2 along the dividing line 21, whereby the semiconductor wafer 2 is divided along the dividing line 21 whose strength has been reduced by the formation of the deteriorated layer 210. After the dividing step is thus carried out along the predetermined dividing line 21, the base 51 is moved a distance corresponding to the interval between dividing lines 21 in the indexing direction perpendicular to the sheet to carry out the above dividing step. After the dividing step is carried out along all the dividing lines 21 extending in the predetermined direction, the base 51 is turned at 90° to further carry out the above dividing step along dividing lines 21 formed on the semiconductor wafer 2 in a direction perpendicular to the predetermined direction, thereby dividing the semiconductor wafer 2 into individual semiconductor chips. Since the back surfaces of the obtained chips have the dicing tape 30 affixed thereto, the chips do not fall apart and maintain the state of the wafer.

Figure 9:
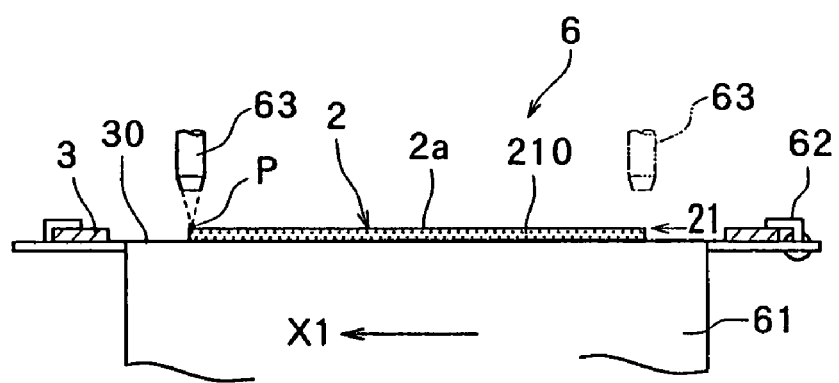
FIG. 9 is a diagram showing a second embodiment of the dividing step in the wafer dividing method of the present invention.

A second example of the dividing step will be described with reference to FIG. 9. This second example of the dividing step shown in FIG. 9 is carried out by using a laser beam processing machine similar to the laser beam processing machine shown in FIGS. 3 to 5. That is, the semiconductor wafer 2 (in which the deteriorated layers 210 are formed along the dividing lines 21) supported to the frame 3 via the dicing tape 30 is placed on the chuck table 61 of the laser beam processing machine 6 in such a manner that the dicing tape 3 side comes into contact with the chuck table 61 (therefore, the front surface 2a of the semiconductor wafer 2 faces up) and suction-held by a suction means that is not shown, and the frame 3 is fixed by a clamp mechanism 62. Thereafter, the chuck table 61 is moved to a laser beam application area where the condenser 63 of laser beam application means is located to bring one end (left end in FIG. 9) of a predetermined dividing line 21 to a position right below the condenser 63. The chuck table 61, that is, the semiconductor wafer 2 is moved in the direction indicated by the arrow X1 in FIG. 9 at a predetermined feed rate while a continuous-wave laser beam having absorptivity for the semiconductor wafer 2 is applied from the condenser 63. When the application position of the condenser 63 reaches the other end (right end in FIG. 9) of the predetermined dividing line 21, the application of the laser beam is suspended and the movement of the chuck table 61, that is, the semiconductor wafer 2 is stopped. In this dividing step, by setting the focusing point P of the continuous-wave laser beam to the front surface 2a (top surface) of the semiconductor wafer 2 to heat the dividing line 21 where the deteriorated layer 210 has been formed, thermal stress is generated, thereby giving a heat shock. As a result, a split portion is formed along the dividing line 21 where the deteriorated layer 210 has been formed to divide the semiconductor wafer 2. The output of the laser beam applied along the dividing line 21 where the deteriorated layer 210 has been formed in the dividing step is enough to heat the semiconductor wafer 2 to such an extent that it gives a moderate temperature gradient (100 to 400° C.), and such temperature does not melt silicon.

The processing conditions in the above dividing step are set as follows, for example.

Light source: LD excited Nd: YAG second harmonic laser (CW)
Wavelength: 532 nm
output: 10 W
Focusing spot diameter: 0.5 mm (heating a relatively wide area including the deteriorated layer 210)
Processing-feed rate: 100 mm/sec After the above dividing step is carried out, the chuck table 61, that is, the semiconductor wafer 2 is moved a distance corresponding to the interval between dividing lines 21 in the indexing direction perpendicular to the sheet in FIG. 9 while a continuous-wave laser beam is applied as described above. After the above processing-feeding and index-feeding are carried out along all the dividing lines 21 formed in the predetermined direction, the chuck table 61, that is, the semiconductor wafer 2 is turned at 90° to carry out the above processing-feed and indexing-feed along dividing lines 21 formed in a direction perpendicular to the above predetermined direction, whereby the semiconductor wafer 2 is split and divided along the dividing lines 21. Although the semiconductor wafer 2 is split along the dividing lines 21 to be divided into individual chips, the individual chips do not fall apart and maintain the state of the wafer as the back surface 2b of the semiconductor wafer 2 has the dicing tape 30 affixed thereto.

Figure 10:
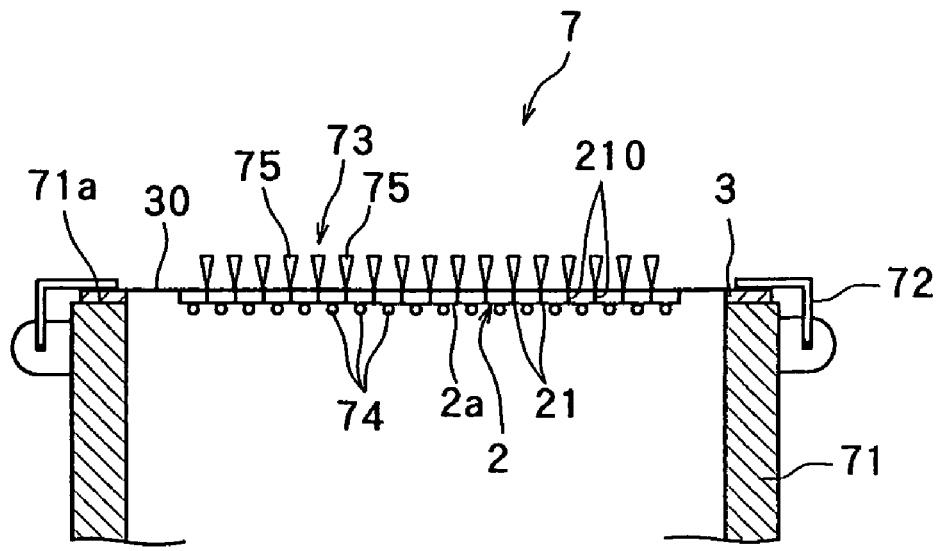
FIG. 10 is a diagram showing a third embodiment of the dividing step in the wafer dividing method of the present invention.

A third example of the dividing step will be described with reference to FIG. 10. This third example of the dividing step shown in FIG. 10 is carried out by using a bending dividing device 7, which comprises a cylindrical base 71 and a bending load application means 73. That is, the frame 3 supporting the semiconductor wafer 2 (in which the deteriorated layers 210 are formed along the dividing lines 21) via the dicing tape 30 is placed on the placing surface 71a of the cylindrical base 71 in such a manner that the dicing tape 30 side faces up (therefore, the front surface 2a of the semiconductor wafer 2 faces down) and fixed by clamps 72. The front surface 2a (undersurface) of the semiconductor wafer 2 is then placed on a plurality of columnar support members 74 that are arranged parallel to one another and constitute the bending load application means 73. At this point, the semiconductor wafer 2 is placed in such a manner that each dividing line 21 formed in a predetermined direction of the semiconductor wafer 2 is positioned between adjacent support members 74 and 74. The semiconductor wafer 2 is then pressed by pressing members 75 along the dividing lines 21 from the side of the dicing tape 30 affixed to the back surface 2b of the semiconductor wafer 2. As a result, a bending load acts on the semiconductor wafer 2 along the dividing lines 21 to generate tensile stress on the front surface 2a, whereby the semiconductor wafer 2 is split and divided along the dividing lines 21 whose strength has been reduced by the formation of the deteriorated layers 210. After the semiconductor wafer 2 is divided along the deteriorated layers 210, that is, the dividing lines 21 formed in the predetermined direction, the cylindrical base 71, that is, the semiconductor wafer 2 is turned at 90° and the above dividing work is carried out along dividing lines 21 formed in a direction perpendicular to the above predetermined direction to divide the semiconductor wafer 2 into individual chips. Since the back surfaces of the individual chips have the dicing tape 30 affixed thereto, the chips do not fall apart and maintain the state of the semiconductor wafer 2.

Figure 11:
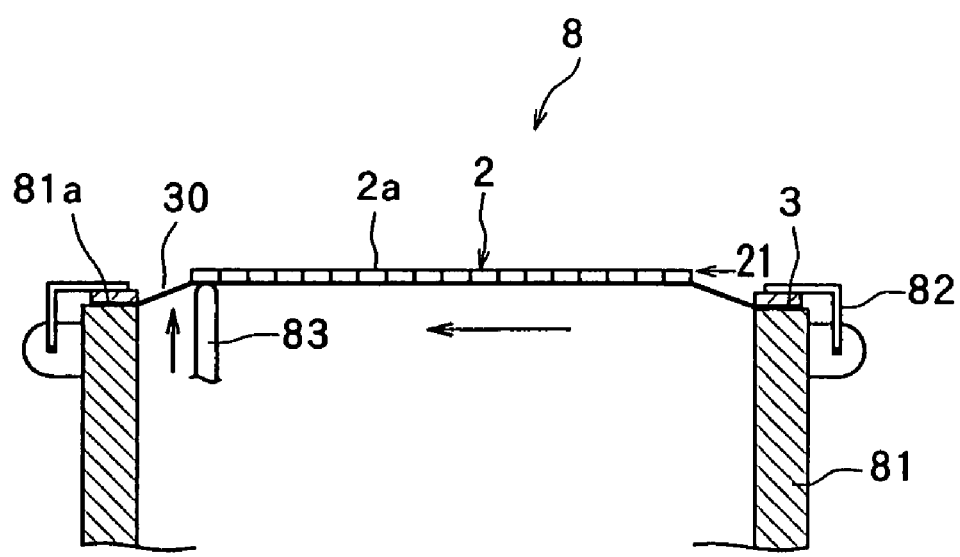
FIG. 11 is a diagram showing a fourth embodiment of the dividing step in the wafer dividing method of the present invention.

A fourth example of the dividing step will be described with reference to FIG. 11. This fourth example of the dividing step shown in FIG. 11 is carried out by using a bending dividing device 8, which comprises a cylindrical base 81 and a pressing member 83 as a bending load application means. This base 81 is so constituted as to be able to be moved in the horizontal direction and the direction perpendicular to the sheet in FIG. 11 and also turned by a moving means that is not shown. The frame 3 supporting the semiconductor wafer 2 (in which the deteriorated layers 210 are formed along the dividing lines 21) via the dicing tape 30 is placed on the placing surface 81a of the thus constituted cylindrical base 81 in such a manner that the dicing tape 30 side comes into contact with the placing surface 81a (therefore, the front surface 2a of the semiconductor wafer 2 faces up) and fixed by clamps 82. Thereafter, the base 81 is operated by the moving means (not shown) to bring one end (left end in FIG. 11) of a predetermined dividing line 21 formed on the semiconductor wafer 2 to a position opposite to the pressing member 83, and the pressing member 83 is moved up in FIG. 11 to a position where it presses the dicing tape 30 affixed to the semiconductor wafer 2. The base 81 is moved in the direction indicated by the arrow. As a result, a bending load is applied to the semiconductor wafer 2 along the dividing line 21 pressed by the pressing member 83 to generate tensile stress on the front surface 2a, whereby the semiconductor wafer 2 is split and divided along the dividing line 21 whose strength has been reduced by the formation of the deteriorated layer 210. After the dividing step is carried out along the predetermined dividing line 21, the base 81 is moved a distance corresponding to the interval between dividing lines 21 in the indexing direction perpendicular to the sheet to carry out the above dividing step. After the dividing step is carried out on all the dividing lines 21 extending in the predetermined direction, the base 81 is turned at 90° to carry out the above dividing step on dividing lines 21 formed in a direction perpendicular to the predetermined direction, thereby dividing the semiconductor wafer 2 into individual chips. Since the back surfaces of the obtained chips have the dicing tape 30 affixed thereto, the chips do not fall apart and maintain the state of the wafer.

In the step of dividing the semiconductor wafer 2 along the dividing lines 21, for example, a method of splitting the semiconductor wafer 2 along the dividing lines 21 whose strength has been reduced by the formation of the deteriorated layers 210 by placing the semiconductor wafer 2 having the dicing tape 30 affixed thereto on a soft rubber sheet and pressing the top surface of the semiconductor wafer 2 with a roller may be employed, besides the above-described dividing method.

After the above dividing step is carried out, there comes an expansion step for enlarging the interval between chips by stretching the dicing tape 30 affixed to the wafer divided into individual chips. This expansion step is carried out by using a pick-up device 9 shown in FIG. 12 and FIGS. 13(a) and 13(b). The pick-up device 9 will be described hereinbelow. The illustrated pick-up device 9 comprises a cylindrical base 91 having a placing surface 91a for placing the above frame 3 and an expanding means 92 for stretching the dicing tape 30 mounted to the frame 3 and arranged in the base 91 concentrically. The expanding means 92 comprises a stretching member 93 for supporting the area 301 where the semiconductor wafer 2 exists in the dicing tape 30. This stretching member 93 can move vertically (axial direction of the cylindrical base 91) between a standard position shown in FIG. 13(a) and an expansion position shown in FIG. 13(b) above the standard position by a lifting means that is not shown. In the illustrated embodiment, ultraviolet lamps 94 are installed in the stretching member 93.

The expansion step which is carried out using the above pick-up device 9 will be described with reference to FIG. 12 and FIGS. 13(a) and 13(b).

Figure 12:
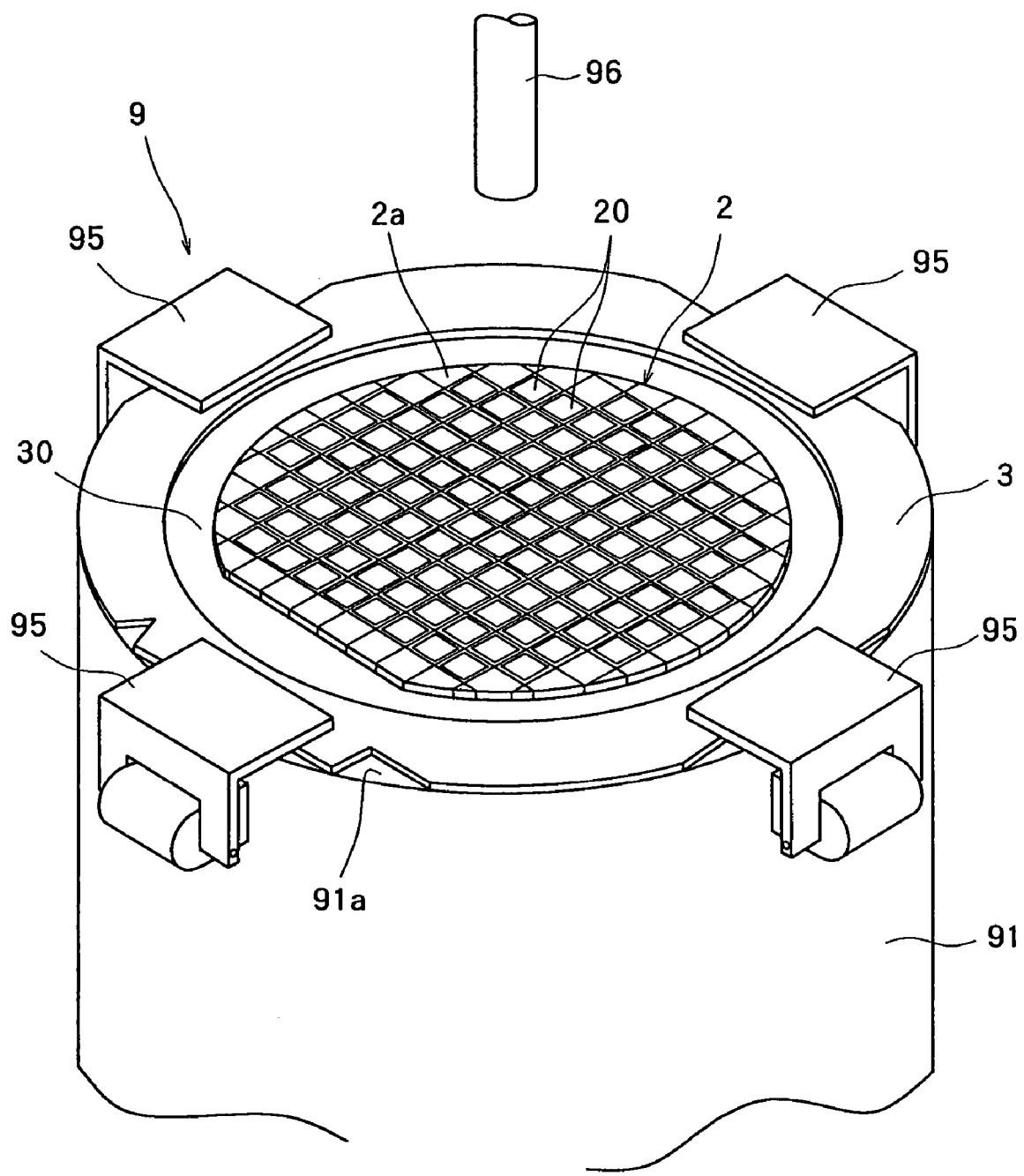
FIG. 12 is a perspective view of a pick-up device for carrying out the expansion step and the pick-up step in the wafer dividing method of the present invention.
Figure 13:
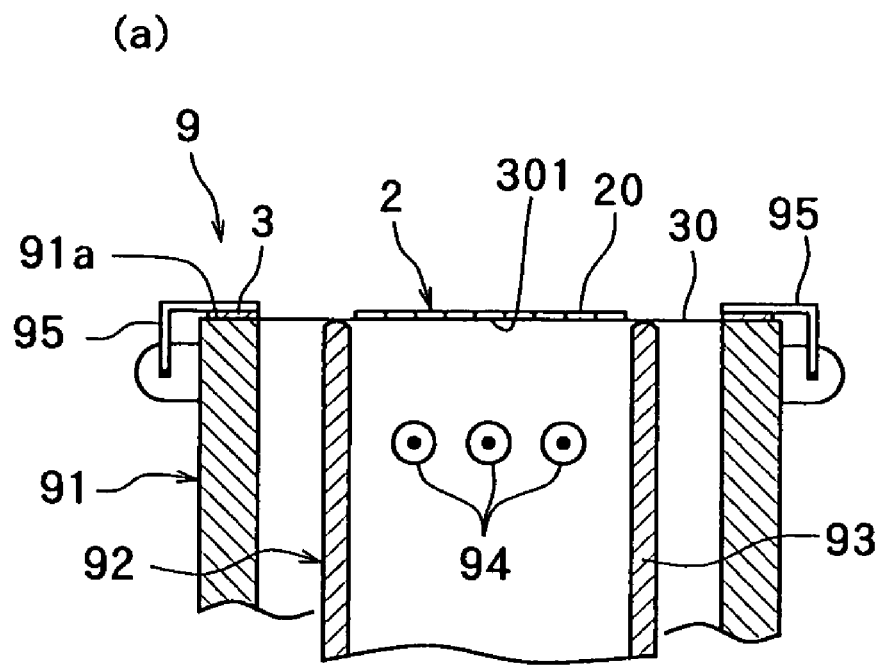
FIGS. 13(a) and 13(b) are diagrams showing the expansion step in the wafer dividing method of the present invention.
Figure 13:
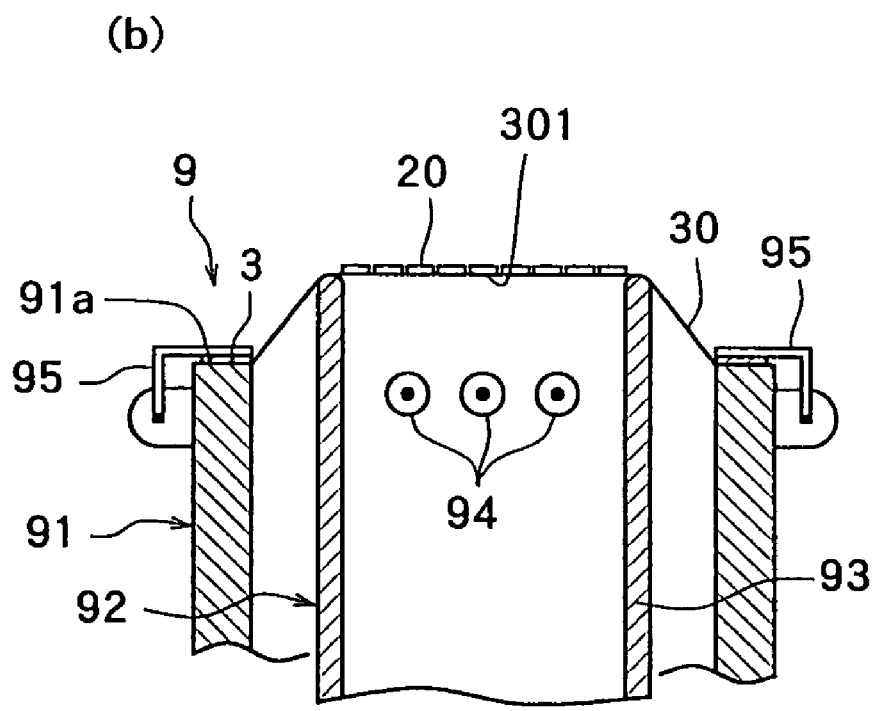

The frame 3 mounting the dicing tape 30 affixed to the back surface 2b of the semiconductor wafer 2 divided into individual chips 20 as described above is placed on the placing surface 91a of the cylindrical base 91 and fixed on the base 91 by clamps 95 as shown in FIG. 12 and FIG. 13(a). Then, the stretching member 93 of the expanding means 92 supporting the area 301 where the wafer 2 exists in the above dicing tape 30 is moved up to the expansion position shown in FIG. 13(b) from the standard position shown in FIG. 13(a) by the lifting means that is not shown. As a result, the extensible dicing tape 30 is stretched, whereby a slippage occurs between the dicing tape 30 and the chips 20, thereby reducing adhesion therebetween. Therefore, the chips 20 can be easily picked up from the dicing tape 30, and a space is formed between adjacent semiconductor chips 20.

Then, a pick-up collet 96 arranged above the pick-up device 9 is activated to pick up the individual chips 20 from the upper surface of the dicing tape 30 and carry them to a tray (not shown), as shown in FIG. 12 (pick-up step). At this point, the ultraviolet lamps 94 in the stretching member 93 are turned on to apply ultraviolet radiation to the dicing tape 30 so as to reduce the adhesive strength of the dicing tape 30, thereby making it possible to pick up the semiconductor chips 20 from the dicing tape 30 more easily.

Figure 14:
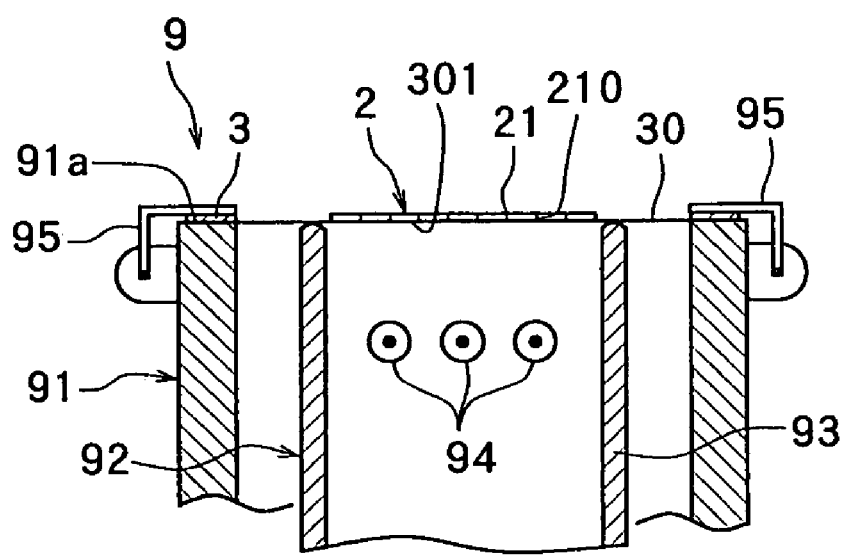
FIGS. 14(a) and 14(b) are diagrams showing the dividing step and the expansion step, which are carried out using the pick-up device shown in FIG. 12.
Figure 14:
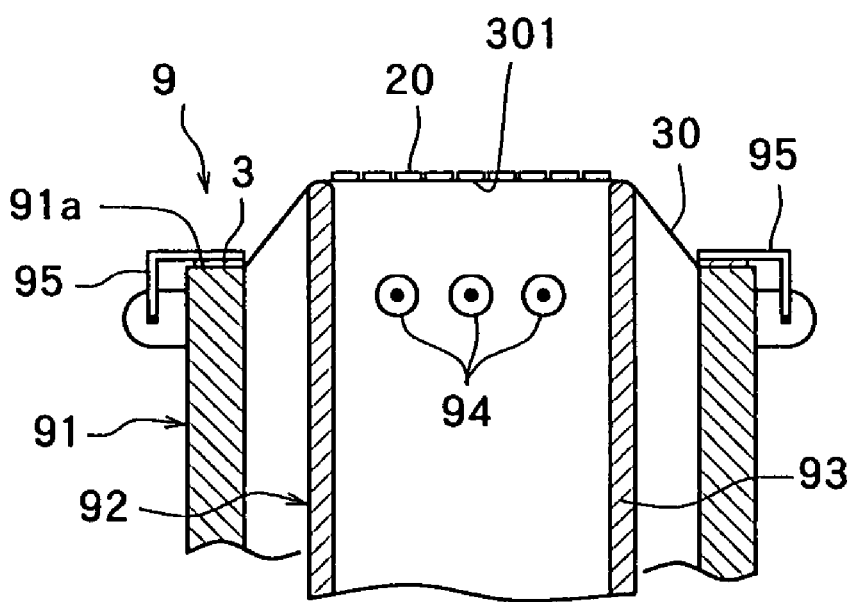

The above dividing step may also be carried out by using the above pick-up device 9. That is, as shown in FIG. 14(a), the frame 3 supporting the semiconductor wafer 2 (in which the deteriorated layers 210 are formed along the dividing lines 21) via the dicing tape 30 before the above dividing step is carried out is placed on the placing surface 91a of the cylindrical base 91 and fixed on the base 91 by the clamps 95. As shown in FIG. 14(b), the stretching member 93 of the expanding means 92 supporting the area 301 where the wafer 2 exists in the above dicing tape 30 is moved up from the standard position shown in FIG. 14(a) to the expansion position shown in FIG. 14(b) by the lifting means that is not shown. As a result, the extensible dicing tape 30 is stretched so that tensile force acts radially on the semiconductor wafer 2 having the dicing tape 30 affixed thereto. When tensile force thus acts radially on the semiconductor wafer 2, the semiconductor wafer 2 is split along the deteriorated layers 210 to be divided into individual semiconductor chips 20 as the strength of the deteriorated layers 210 formed along the dividing lines 21 has been reduced. The expansion or elongation of the dicing tape 30 in the above dividing step can be adjusted by the upward movement of the stretching member 93. According to experiments conducted by the inventors of the present invention, when the dicing tape 30 was stretched about 20 mm, the semiconductor wafer 2 could be divided along the deteriorated layers 210. By carrying out the dividing step like this, a slippage occurs between the dicing tape 30 and the chips 20, thereby reducing adhesion therebetween. As a result, the chips 20 can be easily picked up from the dicing tape 30 and a space is formed between adjacent chips 20. Thereafter, the pick-up collet 96 arranged above the pick-up device 9 is activated to pick up the individual chips 20 from the dicing tape 30 and carry them to the tray (not shown), as shown in FIG. 12.

What is claimed is:

1. A method of dividing, a wafer having function elements formed in areas sectioned by a plurality of dividing lines formed in a lattice pattern on the front surface, comprising:
    a frame holding step for affixing the back surface of the wafer to a dicing tape mounted on an annular frame;
    a deteriorated region forming step for forming a plurality of deteriorated regions along the plurality of dividing lines in the inside of the wafer by applying a pulse laser beam, capable of passing through the wafer, to the wafer along the plurality of dividing lines, from the side of the front surface of the wafer held on the frame;
    a dividing step for dividing the wafer into individual chips along the plurality of dividing lines by exerting external force along the plurality of dividing lines where the plurality of deteriorated regions have been formed in the wafer held on the frame;
    an expansion step for enlarging the interval between chips by stretching the dicing tape affixed to the wafer divided into individual chips; and
    a picking up step for picking up each chip from the expanded dicing tape.

2. The wafer dividing method according to claim 1, wherein the plurality of deteriorated regions formed in the inside of the wafer in the deteriorated region forming step are exposed to at least the back surface of the wafer.

3. The wafer dividing method according to claim 1, wherein the dividing step is carried out by stretching the dicing tape in the expansion step.

* * * * *